(12) United States Patent
Park et al.

(10) Patent No.: US 7,675,771 B2
(45) Date of Patent: Mar. 9, 2010

(54) CAPACITOR-LESS DRAM CIRCUIT AND METHOD OF OPERATING THE SAME

(75) Inventors: Duk-Ha Park, Suwon-si (KR); Ki-Whan Song, Yongin-si (KR); Jin-Young Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 192 days.

(21) Appl. No.: 11/882,932

(22) Filed: Aug. 7, 2007

(65) Prior Publication Data
US 2008/0123439 A1 May 29, 2008

(30) Foreign Application Priority Data

| Nov. 24, 2006 | (KR) | ...................... 10-2006-0117007 |
| Dec. 22, 2006 | (KR) | ...................... 10-2006-0132912 |
| Dec. 22, 2006 | (KR) | ...................... 10-2006-0132913 |

(51) Int. Cl.
*G11C 11/34* (2006.01)

(52) U.S. Cl. .................. 365/182; 365/203; 365/205

(58) Field of Classification Search .................. 365/182, 365/203, 205
See application file for complete search history.

(56) References Cited

U.S. PATENT DOCUMENTS

| 6,567,330 B2 | 5/2003 | Fujita et al. |
| 6,822,907 B2 | 11/2004 | Maruyama et al. |
| 6,882,008 B1 | 4/2005 | Ohsawa |
| 6,934,186 B2 | 8/2005 | Fasan et al. |
| 6,937,516 B2 | 8/2005 | Fazan et al. |
| 7,184,348 B2 | 2/2007 | Crippa et al. |

(Continued)

FOREIGN PATENT DOCUMENTS

JP 2004-103159 4/2004

(Continued)

OTHER PUBLICATIONS

Takashi Ohsawa et al. "Memory Design Using a One-Transistor Gain Cell on SOI". IEEE Journal of Solid State Circuits, vol. 73, No. 11. pp. 1510-1522, Nov. 2002.

(Continued)

*Primary Examiner*—Hoai V Ho
(74) *Attorney, Agent, or Firm*—Harness, Dickey & Pierce

(57) ABSTRACT

One embodiment includes a plurality of word lines, a plurality of source lines, a plurality of bit lines intersecting with the plurality of word lines, and a plurality of memory cells formed at intersections of the plurality of word lines and the plurality of bit lines. Each of the plurality of memory cells is a floating body cell. A gate of each floating body cell is connected to one of the word lines, a drain of each floating body cell is connected to one of the bit lines, and a source of each floating body cell is connected to one of the source lines. At least one bit line and source line selecting circuit is configured to selectively connect each of the plurality of bit lines to a first output bit line and to selectively connect the source lines to a source voltage. At least one sense amplifier is configured to sense data based on a voltage on the first output bit line.

34 Claims, 12 Drawing Sheets

U.S. PATENT DOCUMENTS

| | | |
|---|---|---|
| 7,400,547 B2 | 7/2008 | Oikawa |
| 2003/0231524 A1* | 12/2003 | Ohsawa ................ 365/189.07 |
| 2005/0013163 A1* | 1/2005 | Ferrant et al. .......... 365/185.01 |
| 2005/0068807 A1 | 3/2005 | Ohsawa et al. |
| 2005/0259489 A1 | 11/2005 | Ohsawa et al. |
| 2006/0114717 A1 | 6/2006 | Fasan et al. |
| 2006/0157785 A1* | 7/2006 | Morikado .................... 257/347 |
| 2007/0133330 A1* | 6/2007 | Ohsawa ....................... 365/222 |
| 2007/0159903 A1* | 7/2007 | Kim et al. .................... 365/207 |
| 2008/0151665 A1 | 6/2008 | Kim et al. |

FOREIGN PATENT DOCUMENTS

| | | |
|---|---|---|
| JP | 2004-335883 | 11/2004 |
| JP | 2005-108341 | 4/2005 |
| JP | 2005-251256 | 9/2005 |
| JP | 2006-040421 | 2/2006 |
| JP | 2006-065901 | 3/2006 |
| JP | 2006-073055 | 3/2006 |
| JP | 2006-127631 | 5/2006 |
| KR | 100122507 B1 | 9/1997 |
| KR | 10-2003-0015823 | 2/2003 |

OTHER PUBLICATIONS

S. Ohkhonin et al. "A Capacitor-Less 1T-DRAM Cell". IEEE Electron Device Letters, vol. 23, No. 2. pp. 85-87, Feb. 2002.

* cited by examiner

CAPACITOR-LESS DRAM CIRCUIT AND METHOD OF OPERATING THE SAME

FOREIGN PRIORITY INFORMATION

A claim of priority under 35 U.S.C. 119 is made to Korean Application Nos. 10-2006-0117007, 10-2006-132912 and 10-2006-132913, filed Nov. 24, 2006, Dec. 22, 2006 and Dec. 22, 2006, respectively, the entire contents of all of which are hereby incorporated by reference.

BACKGROUND

FIG. 1 illustrates a prior art integrated semiconductor memory circuit. As shown, the memory circuit includes a memory array and sensing structure 100, which will be described in greater detail below with respect to FIGS. 2-4. A command decoder 102 receives a command CMD (e.g., read, write, etc.), and decodes the command into control signals for controlling a row decoder 104 and a column decoder 106. The row decoder 104 and column decoder 106 receive the control signals and address information, and generate drive signals based on the controls signals and address information. For example, the row decoder 104 generates word line drive signals to drive word lines WL of the memory array and sensing structure 100. The column decoder 106 generates bit lines select signals BLS for driving bit line selectors of the memory array and sensing structure 100. The data output from the memory array and sensing structure 100 are output on input/output (I/O) lines, and this output data is sensed by an I/O sense amplifier 108.

FIG. 2 shows the constitution of a cell array 1 and data sense circuits 3 connected thereto in the memory array and sensing structure 100. A DRAM cell MC is composed of one MISFET having a channel body in a floating state. This type of memory cell is also referred to more generally as a floating body cell. The structure of a DRAM cell MC using an n-channel MISFET is shown in FIG. 3. As shown in FIG. 3, the DRAM cell MC has a silicon substrate 10, a p-type silicon layer 12 isolated from the silicon substrate 10 by an insulating film 11 such as a silicon oxide film, a gate electrode 14 formed with a gate insulating film 13 there between, and n-type diffusion regions 15 and 16, which are a source and a drain, respectively. The p-type silicon layer 12 between the n-type diffusion regions 15 and 16 serves as a channel body.

The memory cell array 1 is structured as shown in FIG. 4. Specifically, each of the DRAM cells MC has a floating channel body isolated from one another, sources of the DRAM cells MC are fixed at a reference voltage (ground potential), gates of the DRAM cells aligned in one direction are connected to word lines WL, and drains of the DRAM cells aligned in a direction intersecting the word lines WL are connected to bit lines BL.

The DRAM cell MC dynamically stores a first data state in which the p-type silicon layer 12, which is the channel body, is set at a first potential and a second data state in which the p-type silicon layer 12 is set at a second potential. More specifically, the first data state is written in a manner in which high positive level voltages are applied to a selected word line WL and a selected bit line BL to make a selected DRAM cell perform a pentode operation and majority carriers (holes in the case of the n-channel) generated by impact ionization, which occurs near the drain junction, are held in the channel body. This is, for example, data "1". The second data state is written in a manner in which a high level voltage is applied to the selected word line WL to raise the channel body potential by capacitive coupling while a potential of the selected bit line BL is set at a low level, and a forward bias current is sent to the junction of the channel body and the drain of the selected DRAM cell so as to emit the majority carriers in the channel body into the drain. This is, for example, data "0". The DRAM cell MC may also be written in the first data state through gate induced drain leakage (GIDL). Here, a negative potential is applied to the word line while a positive potential is applied to the bit line. Again, the source remains fixed at the reference, ground voltage. This causes a high electric field in the gate/drain region to overlap, and tunneling of electrons from valence band to conduction band occurs. The tunneling electrons generate electron-hole pairs and electrons move to the drain while holes move to the body. Thus, the body potential of the transistor rises as with impact ionization; however, the current generated by GIDL is much less than with impact ionization.

As a result of biasing the substrate by the channel body potential, a threshold voltage Vth1 in the case of the data "1", is lower than a threshold voltage Vth0 in the case of the data "0". Accordingly, at the time of a data read operation, the data can be judged by detecting a cell current difference caused by a threshold voltage difference.

As will be appreciated, the DRAM cell of this nature eliminates the need for a capacitor to store data, and provides for further reduction in the size of integrated semiconductor memory circuits.

The data storage state is judged by comparing a cell current to a reference current. As a source for the reference current, a dummy cell DMC is prepared as shown in FIG. 2. The dummy cell DMC may be generally designed such that the reference current produced is at an intermediate value between a cell current Icell1 when the DRAM cell is the "1" data and a cell current Icell0 when the DRAM cell is the "0". However, in FIG. 2, the dummy cell DMC is composed of two MISFETs having the same structure as that of the DRAM cell MC and whose drains are connected in parallel to a dummy bit line DBL provided for every plural bit lines.

The "0" data is written in one MISFET-MC0 and the "1" data is written in the other MISFET-MC1. Gates of these MISFETs-MC0 and MC1 are connected to dummy word lines DWL1 and DWL2 respectively. The dummy word lines DWL1 and DWL2 are selectively driven simultaneously with a selected word line WL at the time of a data sense operation. Accordingly, a reference current Iref passed through the dummy bit line DBL is derived from Iref=Icell0+Icell1. Correspondingly, in data sense circuits 3, a cell current 2.times.Icell, which is double a detected cell current Icell, is generated to be compared with the aforesaid reference current Iref.

As shown in FIG. 2, the data sense circuits 3 are connected to the bit lines BL of the cell array 1 via bit line selecting circuits 2a. The bit line selecting circuits 2a are multiplexers each of which selects one line out of a plurality of the bit lines. In the example of FIG. 1, each of the bit line selecting circuits 2a selects one line out of four bit lines BL0 to BL3 in response to selecting signals BSL0 to BSL3 for the column decoder 106. The plurality of data sense circuits 3 share a reference voltage generating circuit 6 connected to the dummy bit line DBL which is provided for every plural bit lines. The reference voltage generating circuit 6 generates in a reference node RSN a reference voltage corresponding to the aforesaid reference current Iref, which is passed through the dummy bit line DBL and the dummy bit line selecting circuit 2b. Each of first current sense amplifiers 4a includes current mirror circuitry that generates the aforesaid double cell current 2.times.Icell, compares it with the reference current Iref, and generates in sense nodes SN a potential according to the data. Then, second sense amplifiers 4b, each of which detects the difference in the potential between the sense nodes SN and the reference node RSN, are provided.

In addition, between the sense amplifiers 4a and data lines DL (which are connected to the bit lines BL via the bit line selecting circuits 2a) and between the reference voltage generating circuit 6 and a reference data line RDL (which is connected to the dummy bit line DBL via a dummy bit line selecting circuit 2b by controlling a signal DBSL), clamping circuits 5 are provided for suppressing the rise in the voltages of the bit lines BL and the dummy bit line DBL respectively at the time of the data sense operation. The clamping circuits 5 prevent erroneous writing in the DRAM cell MC and the dummy cell DMC at the time of the data read operation, and more specifically, the clamping circuits 5 suppress the voltages of the bit lines BL and the dummy bit line DBL at a low level so that the selected memory cell and the dummy cell perform a triode operation at the time of the data sense operation.

SUMMARY OF THE INVENTION

The present invention relates to semiconductor integrated circuits, and embodiments relate to a semiconductor integrated memory circuit.

One embodiment includes a plurality of word lines, a plurality of source lines, a plurality of bit lines intersecting with the plurality of word lines, and a plurality of memory cells formed at intersections of the plurality of word lines and the plurality of bit lines. Each of the plurality of memory cells is a floating body cell. A gate of each floating body cell is connected to one of the word lines, a drain of each floating body cell is connected to one of the bit lines, and a source of each floating body cell is connected to one of the source lines. At least one bit line and source line selecting circuit is configured to selectively connect each of the plurality of bit lines to a first output bit line and to selectively connect the source lines to a source voltage. At least one sense amplifier is configured to sense data based on a voltage on the first output bit line.

In one embodiment, the bit line and source selecting circuit includes a first switching structure associated with each bit line and a second switching structure associated with each source line. Each first switching structure is configured to selectively connect the associated bit line to the first output bit line, and each second switching structure is configured to selectively connect the associated source line with the source voltage.

In one embodiment, the plurality of bit lines, the plurality of word lines and the plurality of memory cells form a twin cell memory structure.

In another embodiment, the plurality of bit lines, the plurality of word lines and the plurality of memory cells form an open bit line structure.

At least one embodiment further includes a first control circuit configured to control operation of the bit line and source line selecting circuit.

At least one embodiment includes a second control circuit configured to apply voltages to the plurality of source lines. For example, the second control circuit is configured to apply different voltages to the plurality of source lines depending on a memory cell operation.

Yet another embodiment includes at least one dummy word line and at least one row of dummy memory cells formed at intersections of the dummy word line and the plurality of bit lines. Each of the plurality of dummy memory cells is a floating body cell. A gate of each dummy floating body cell is connected to the dummy word line, a drain of each dummy floating body cell is connected to one of the bit lines, and a source of each dummy floating body cell is connected to one of the source lines. The dummy memory cells associated with even numbered bit lines are for storing a first logic state, and the dummy memory cells associated with odd numbered bit lines are for storing a second logic state. The second logic state is opposite the first logic state. An equalization circuit may be configured to selectively connect each odd numbered bit line and a preceding even numbered bit line.

An alternative embodiment further includes first and second dummy bit lines, first and second dummy source lines and first and second columns of dummy memory cells. The first column of dummy memory cells is formed at intersections of the plurality of word lines and the first dummy bit line. The second column of dummy memory cells is formed at intersections of the plurality of word lines and the second dummy bit line. Each of the first and second columns of memory cells is a floating body cell. A gate of each first dummy floating body cell is connected to one of the word lines, a drain of each first dummy floating body cell is connected to the first dummy bit line, and a source of each first dummy floating body cell is connected to the second dummy source line. A gate of each second dummy floating body cell is connected to one of the word lines, a drain of each second dummy floating body cell is connected to the second dummy bit line, and a source of each second dummy floating body cell is connected to the second dummy source line. An equalization circuit is configured to selectively connect the first dummy bit line and the second dummy bit line. The bit line and source line selecting circuit may be configured to selectively connect each of the first and second dummy bit lines to a second output bit line and to selectively connect the first and second dummy source lines to a source voltage. The sense amplifier may be configured to sense data based on voltages on the first output bit line and the second output bit line.

In yet another embodiment, the semiconductor integrated circuit includes a plurality of word lines, a plurality of source lines, a plurality of bit lines intersecting with the plurality of word lines, and a plurality of memory cells formed at intersections the plurality of word lines and the plurality of bit lines. Each of the plurality of memory cells is a floating body cell. A gate of each floating body cell is connected to one of the bit lines, a drain of each floating body cell is connected to one of the bit lines, and a source of each floating body cell is connected to one of the source lines. A bit line and source line selecting circuit may be configured to selectively connect each of the plurality of bit lines to an output bit line and to selectively connect the source lines to a source voltage. A sense amplifier may be configured to sense data on the output bit line, and a control circuit may be configured to control operation of the bit line and source line selecting circuit and to control voltages applied to the plurality of source lines such that the sense amplifier is a voltage sense amplifier.

At still further embodiment of the semiconductor integrated circuit includes a plurality of word lines, a plurality of source lines, a plurality of bit lines intersecting with the plurality of word lines, a plurality of memory cells formed at intersections the plurality of word lines and the plurality of bit lines. Each of the plurality of memory cells is a floating body cell. A gate of each floating body cell is connected to one of the word lines, a drain of each floating body cell is connected to one of the bit lines, and a source of each floating body cell is connected to one of the source lines. A selecting circuit may be configured to selectively output data on the plurality of bit lines and to selectively apply voltages to the plural of source lines, and a sense amplifier may be configured to sense data on the output bit line.

Another embodiment of the semiconductor integrated circuit includes a plurality of memory cell portions. Each memory cell portion including, a plurality of word lines, a plurality of source lines, a plurality of bit lines intersecting with the plurality of word lines, and a plurality of memory cells formed at intersections the plurality of word lines and the plurality of bit lines. Each of the plurality of memory cells is a floating body cell. A gate of each floating body cell is connected to one of the word lines, a drain of each floating body cell is connected to one of the bit lines, and a source of each floating body cell is connected to one of the source lines. At least one bit line and source line selecting circuit may be associated with each memory portion. Each bit line and source line selecting circuit may be configured to selectively connect each of the plurality of bit lines in the associate memory portion to an output bit line for the memory portion and to selectively connect the plurality of source lines for the memory portion to a source voltage. At least one sense amplifier may be associated with each memory portion, and each sense amplifier may be configured to sense data on the output bit line of the associated memory cell portion.

The present invention also related to operating semiconductor integrated circuit, and embodiments are directed to operating a semiconductor integrated circuit memory.

In one embodiment, the semiconductor integrated circuit memory includes a plurality of memory cells formed at intersections of a plurality of word lines and a plurality of bit lines. Each of the plurality of memory cells is a floating body cell. A gate of each floating body cell is connected to one of the bit lines, a drain of each floating body cell is connected to one of the bit lines, and a source of each floating body cell is connected to one of the source lines. The embodiment includes applying different voltages to the plurality of source lines depending on a memory cell operation.

For example, the applying step may apply a first voltage to the source line of the floating body cells if a data 1 is being written into the floating body cell, and may apply a second voltage to the source line of the floating body cell if a data 0 is being written into the floating body cell. Here, the second voltage is different than the first voltage.

As another example, the applying step may apply a different voltage to the source line of the floating body cell during a read operation than applied during at least one write operation.

The present invention still further relates to a method of sense amplifying in a semiconductor integrated circuit memory.

In one embodiment, the semiconductor integrated circuit memory includes a plurality of memory cells formed at intersections of a plurality of word lines and a plurality of bit lines. Each of the plurality of memory cells is a floating body cell. A gate of each floating body cell is connected to one of the bit lines, a drain of each floating body cell is connected to one of the bit lines, and a source of each floating body cell is connected to one of the source lines. The embodiment includes selectively connecting one of the plurality of bit lines to an output bit line, and applying a different voltage to the source line of the floating body cell during a read operation than applied during at least one of the write operations. The embodiment further includes sense amplifying data on the output bit line using a voltage sense amplifier.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EXAMPLE EMBODIMENTS

Figure 1:
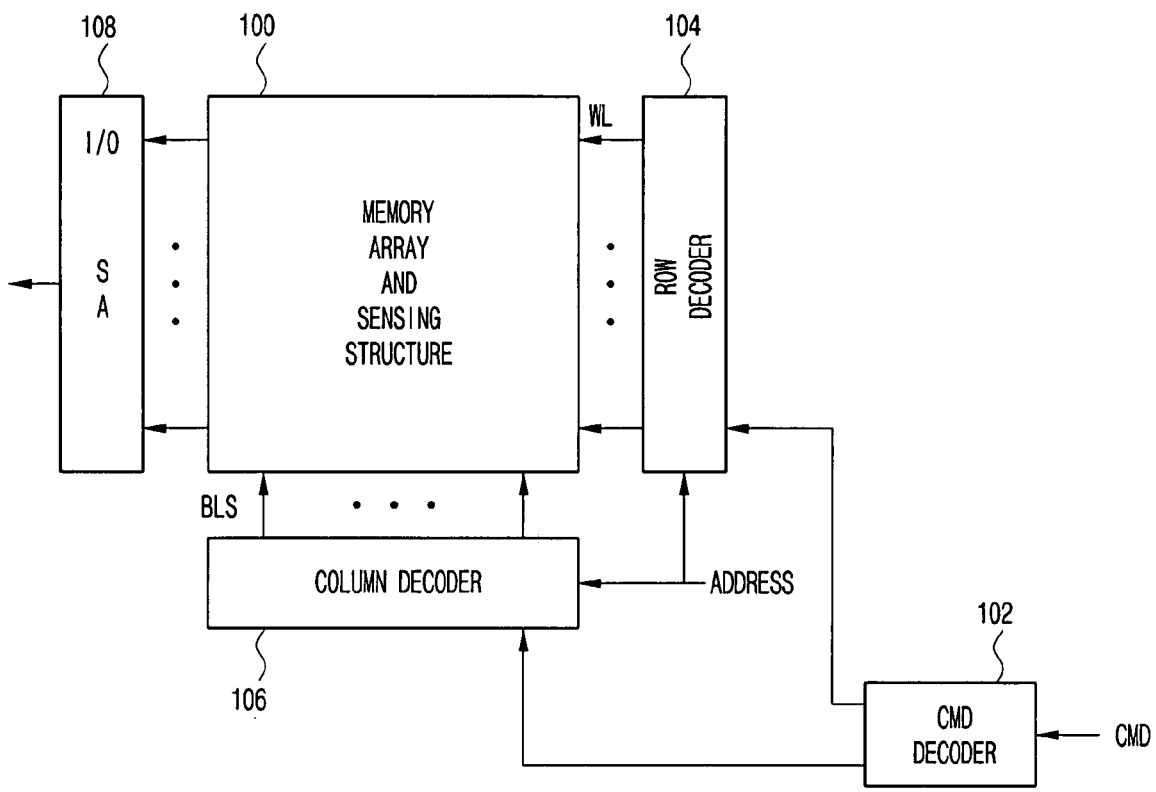
FIG. 1 illustrates a prior art integrated semiconductor memory circuit.
Figure 2:
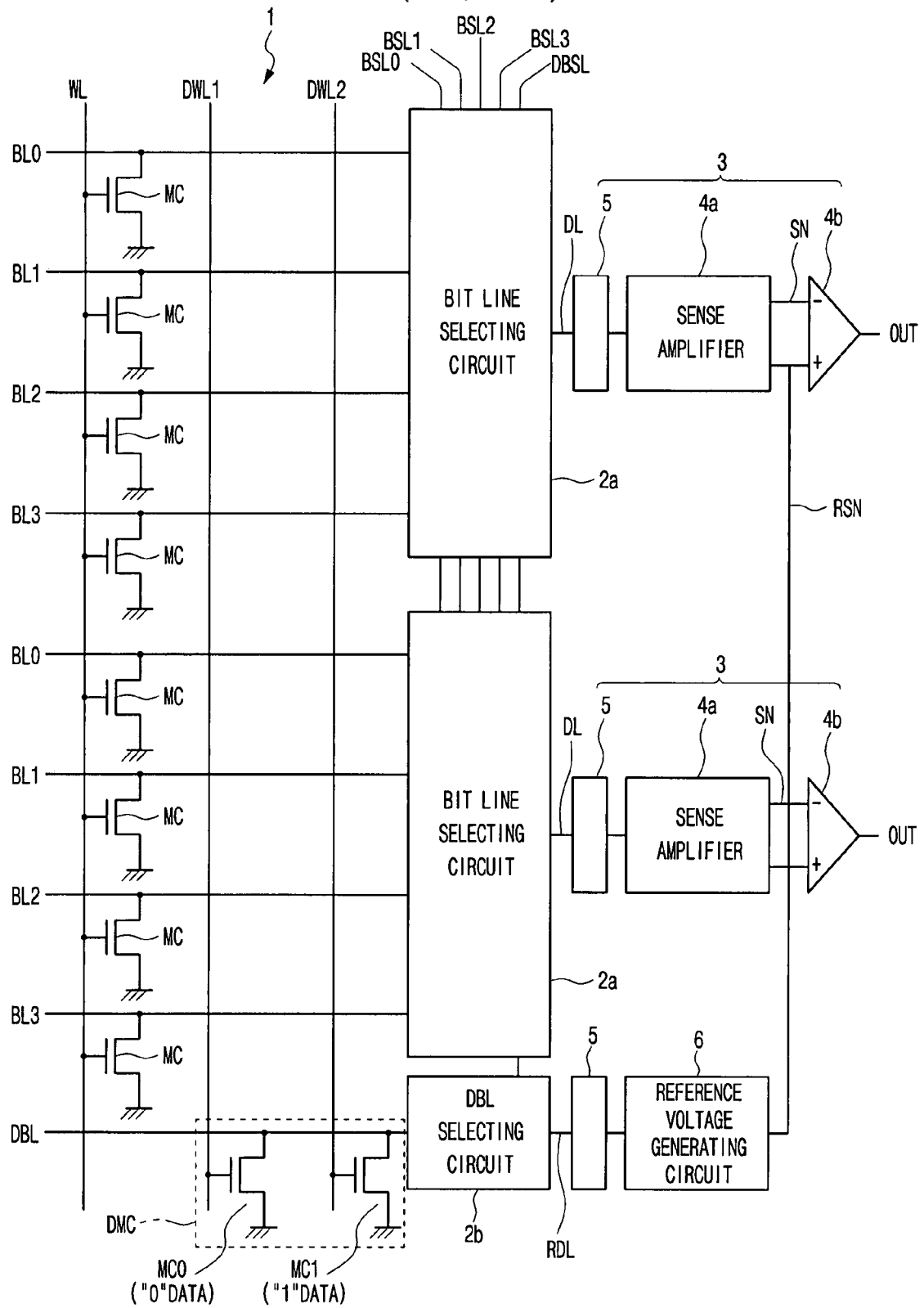
FIG. 2 shows the constitution of a cell array and data sense circuits connected thereto in the memory array and sensing structure of FIG. 1.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
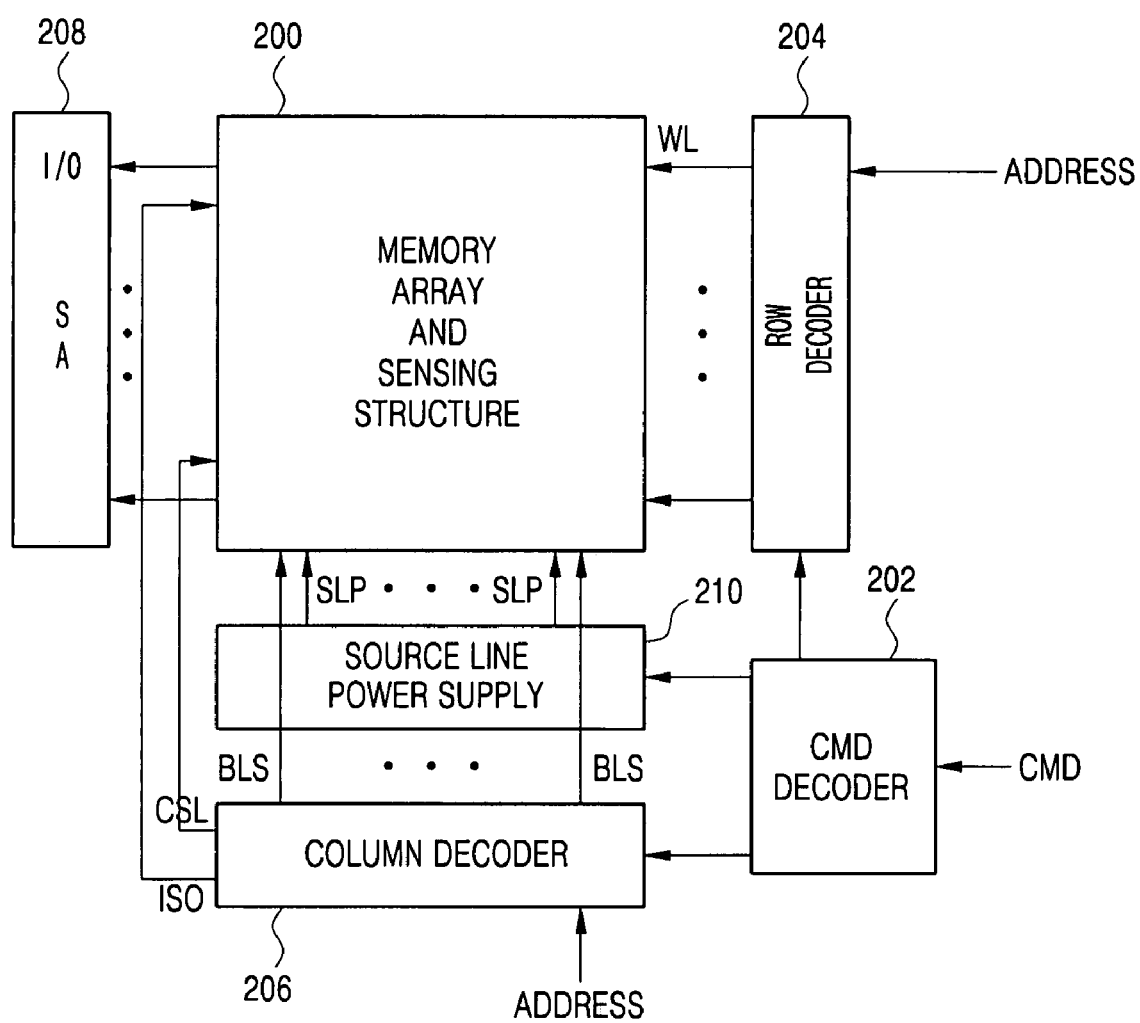
FIG. 5 illustrates an integrated semiconductor memory device according to an embodiment of the present invention.

FIG. 5 illustrates an integrated semiconductor memory device according to an embodiment of the present invention. As shown, the memory device includes a memory array and sensing structure 200, which will be described in greater detail below with respect to FIGS. 6-7. A command decoder 202 receives a command CMD (e.g., read, write, etc.), and decodes the command into control signals for controlling a row decoder 204, a column decoder 206 and a source line power supply 210. The row decoder 204 and column decoder 206 receive the control signals and address information, and generate drive signals based on the controls signals and address information. For example, the row decoder 204 generates word line drive signals to drive word lines WL of the memory array and sensing structure 200. As described in greater detail below, in at least one embodiment, the row decoder 204 may also generate drive signals for dummy word lines, isolation control lines and/or equalization control lines (see FIGS. 11 and 13).

The column decoder 206 generates bit lines select signals BLS for controlling bit line and source line selectors of the memory array and sensing structure 200. As described in greater detail below, in at least one embodiment, the column decoder 206 may also generate isolation selection signals, and column select signals in response to control signals which are generated by the command decoder.

The source line power supply 210 delivers different power levels to the source lines of the memory array in the memory array and sensing structure 200 based on the control signals. More particularly, the source line power supply 210 may supply different voltages depending on whether a read operation, write operation, or pre-charge operation is being performed.

Data output from the memory array and sensing structure 200 are output on input/output (I/O) lines, and this output data is sensed by an I/O sense amplifier 208.

Figure 6:
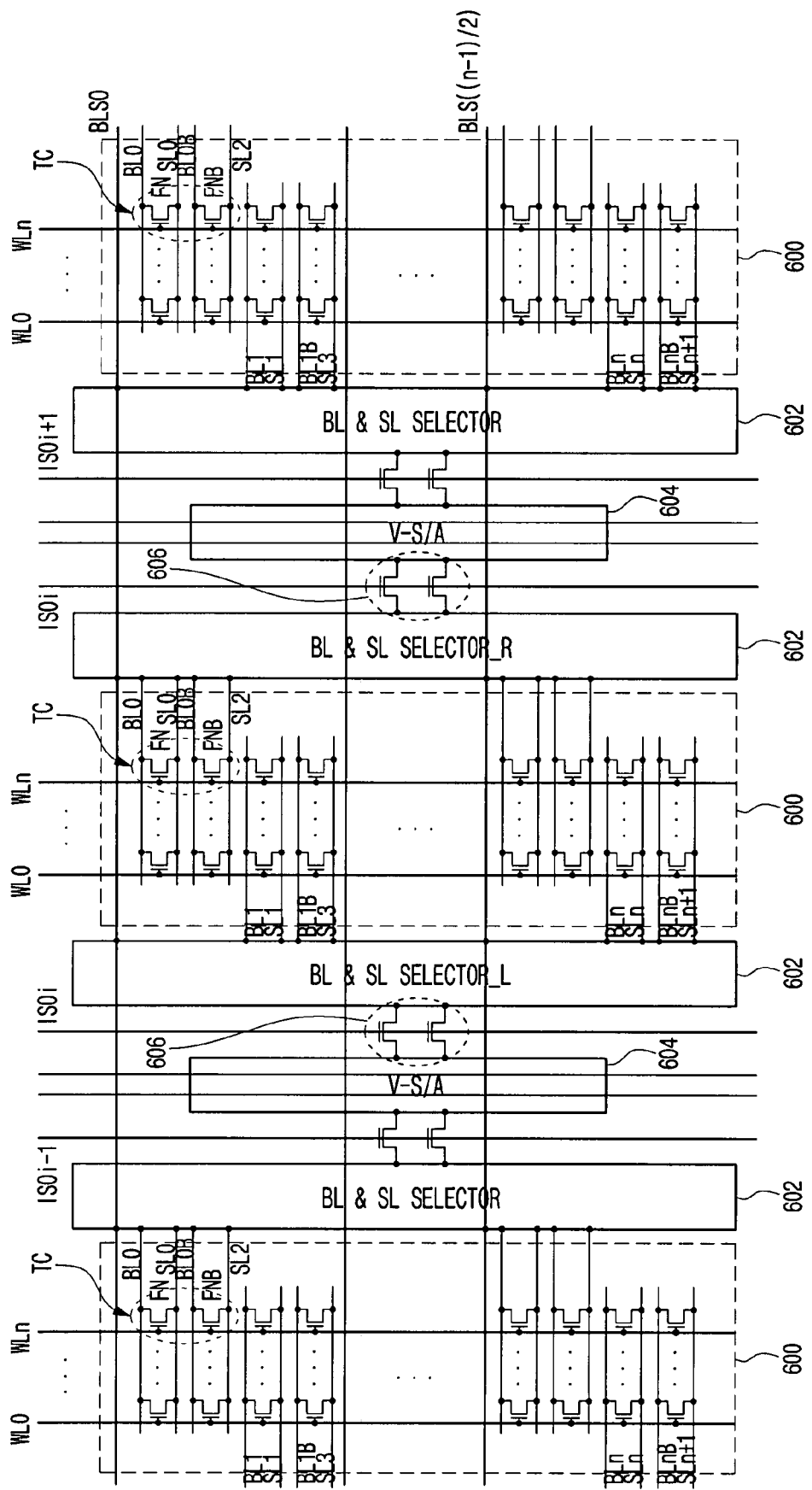
FIG. 6 illustrates a portion of a cell array and data sense circuits connected thereto in the memory array and sensing structure of FIG. 5.

FIG. 6 illustrates a portion of a cell array and data sense circuits connected thereto in the memory array and sensing structure of FIG. 5 according to one embodiment. It will be appreciated that the structure of FIG. 6 may be repeated many times to form the memory array and sensing structure 200. As shown, the memory array and sensing structure includes memory array portions 600. A bit line (BL) and source line (SL) selector 602 is disposed on either side of each memory array portion 600, and a voltage sense amplifier 604 is disposed between adjacent BL and SL selectors 602. Outermost BL and SL selectors 602 have a voltage sense amplifier 604 disposed adjacent thereto. As further shown, a pair of isolation transistors 606 selectively connects each BL and SL selector 602 to an associated voltage sense amplifier 604. The BL and SL selectors 602, the voltage sense amplifiers 604 and the isolation transistors 606 will be described in greater detail below with respect to FIG. 7.

Figure 3:
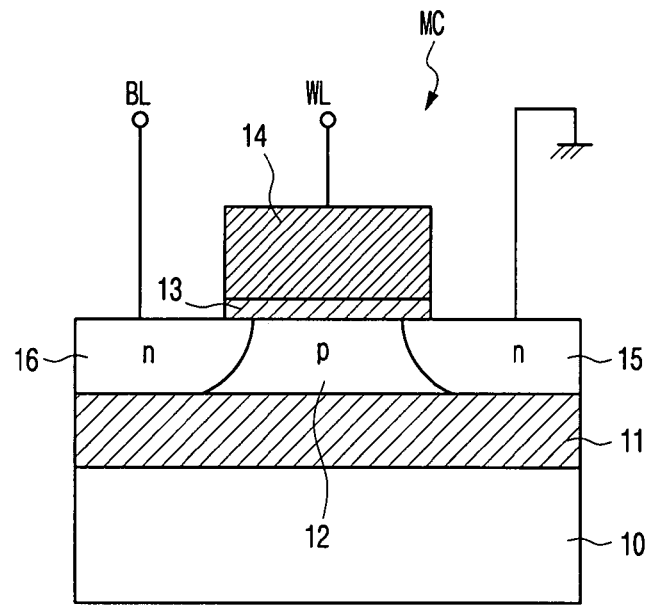
FIG. 3 illustrates the structure of a DRAM cell MC in FIG. 2 using an n-channel MISFET.
Figure 4:
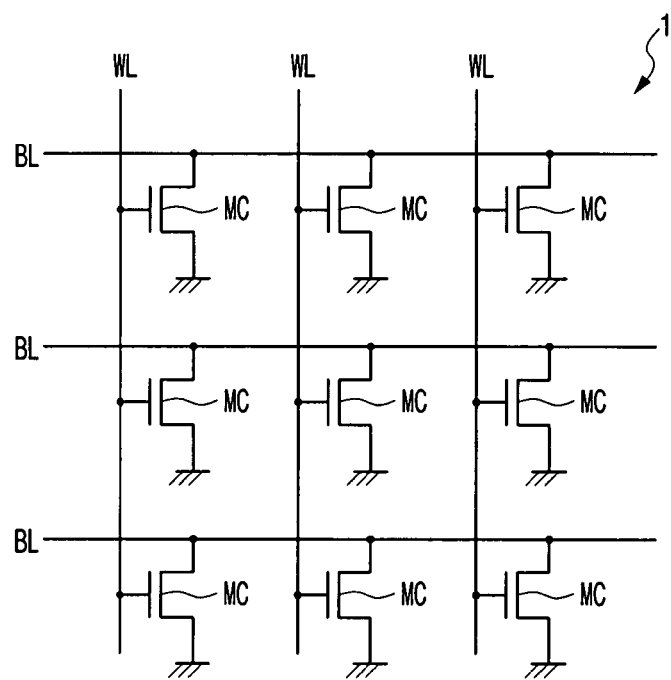
FIG. 4 illustrates the structure of the memory cell array shown in FIG. 2.

Still referring to FIG. 6, the memory array portions 600 include a plurality of word lines WL intersecting with a plurality of bit lines BL, complementary bit lines BLB, and source lines SL. The plurality of bit lines BL, complementary bit lines BLB, source lines SL are in parallel. Memory cells are formed at intersections of the word lines WL and the bit lines BL, and at intersections of the word lines WL and complementary bit lines BLB. The memory array portions 600 employ capacitor-less memory cells FN, FNB that may have the same structure as described previously with respect to FIG. 3; namely, floating body cells or MISFETs may be employed. In particular, the memory array portions 600 employ a twin cell (TC) structure for storing data. Each twin cell TC includes a true cell FN and a complementary cell FNB. The true cell FN is a floating body cell with a gate connected to a word line WL, a source connected to a source line SL and a drain connected to a bit line BL. The complementary cell FNB is a floating body cell with a gate connected to the same word line WL as the true cell FN, a source connected to a source line SL and a drain connected to a complementary bit line BLB. The memory array portion 600 includes twin cells TC arranged in columns and rows, the number of each of which being a matter of design choice. Each row of twin cells TC is associated with a word line WL0, WL1, etc. Each column of twin cells TC is associated with a bit line BL, a complementary bit line BLB, a source line SL. Even numbered bit lines BL0, BL2, etc. and even numbered complementary bit lines BL0B, BL2B, etc. lead to the BL and SL selector_R 602 to the right of the memory array portion 600. Odd numbered bit lines BL1, BL3, etc. and odd numbered complementary bit lines BL1B, BL3B, etc. lead to the BL and SL selector_L 602 to the left of the memory array portion 600. Similarly, even numbered source lines SL0, SL2, etc. lead to the BL and SL selector_R 602 to the right of the memory array portion 600. Odd numbered source lines SL1, SL3, etc. lead to the BL and SL selector_L 602 to the left of the memory array portion 600. Accordingly, half of the bit lines, complementary bit lines, and source lines lead to the BL and SL selector 602 to the right of the memory array portion 600, and the other half lead to the BL and SL selector 602 to the left of the memory array portion 600.

Figure 7:
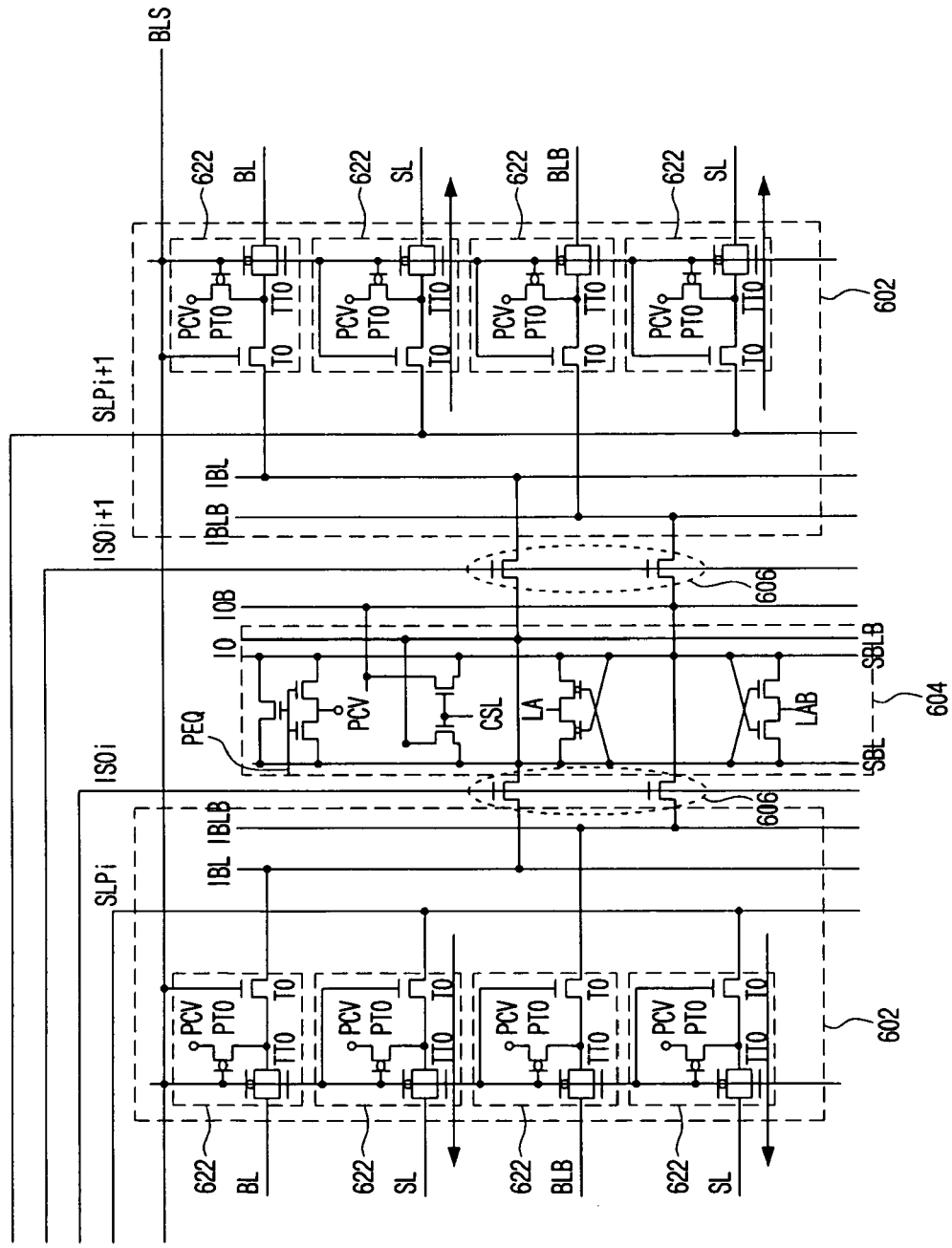
FIG. 7 illustrates the data sense circuit of FIG. 6 in greater detail.

FIG. 7 illustrates the data sense circuit of FIG. 6 in greater detail. Namely, FIG. 7 illustrates the circuits associated with the BL and SL selector 602 and a single voltage sense amplifier 604. It will be appreciated that the other voltage sense amplifiers and associated circuits may have the same structure and operation as that described with respect to FIG. 7. More particularly, FIG. 7 shows the detailed structure of a voltage sense amplifier 604, the pair of BL and SL selectors 602 associated with the voltage sense amplifier 604, and the two pairs of isolation transistors 606 associated with the voltage sense amplifier 604.

As shown, each BL and SL selector 602 includes a control structure 622 associated with each bit line BL, complementary bit line BLB, source lines SL. The control structure includes a transmission gate TT0 connected to the line (e.g., bit line, source line, etc.). The transmission gate TT0 receives the bit line select signal BLS for the associated column of twin cells TC from the column decoder 206 as a control signal. An NMOS transistor T0 is connected in series with the transmission gate TT0, and also receives the bit line select signal BLS at its gate. A PMOS transistor PT0 is connected between a pre-charge voltage supply PCV and a node between the transmission gate TT0 and the NMOS transistor T0. The PMOS transistor PT0 receives the bit line select signal BLS at its gate.

As shown in FIG. 7, the NMOS transistor T0 in the control structure 622 for a bit line BL is connected to an intermediate bit line IBL, the NMOS transistor T0 in the control structure 622 for a complementary bit line BLB is connected to a complementary intermediate bit line IBLB, the NMOS transistor T0 in the control structure 622 for a source line SL is connected to the source power line SLP from the source line power supply 210 for the associated column of twin cells TC.

During operation, a low voltage (e.g., ground voltage) bit line select signal BLS disables the control structures 622 associated with that bit line select signal BLS such that the control structures 622 disconnect the bit line BL, complementary bit line BLB and source line SL from the intermediate bit line IBL, complementary intermediate bit line IBLB, source power line SLP, respectively. However, the PMOS transistor PT0 in each control structure 622 receiving the low voltage bit line select signal BLS turns on. As a result, the pre-charge voltage PCV is supplied to the bit line BL, the complementary bit line BLB, and the source lines SL.

During operation, a high voltage bit line select signal BLS turns off the PMOS transistor PT0 such that the pre-charge voltage PVC is not supplied to the bit line BL, the complementary bit line BLB and the source lines SL. Instead, the NMOS transistor T0 turns on. As a result, the bit line BL is connected to the intermediate bit line IBL, the complementary bit line BLB is connected to the intermediate bit line IBLB, and the source lines SL are connected to the source power line SLP. As shown by the arrows in FIG. 7, the source voltage from the source line power supply 210 is applied to the source lines SL.

The column decoder 206 generates the isolation selection signals ISO, each of which controls the operation of an associated pair of isolation transistors 606. If the isolation selection signal ISO is a high voltage, the isolation transistors 606 turn on, and connect the associated intermediate bit line IBL and complementary intermediate bit line IBLB to the voltage sense amplifier 604. If the isolation selection signal is a low voltage (e.g., ground), the isolation transistors 606 turn off, and disconnect the intermediate bit line IBL and complementary intermediate bit line IBLB from the voltage sense amplifier 604. In other words, the isolation transistors 606 selectively connect the associated BL and SL selector 602 with the voltage sense amplifier 604.

The voltage sense amplifier 604 is a conventional voltage sense amplifier well-known in the art. Accordingly, the structure and operation of the voltage sense amplifier 604 will not be described in great detail. As shown, the isolation transistors 606 selectively connect the intermediate bit line IBL and complementary intermediate bit line IBLB to a sensing bit line SBL and a complementary sensing bit line SBLB, respectively, of the voltage sense amplifier 604. As is well-known, the voltage sense amplifier 604 receives control bias signals LA and LAB, receives the pre-charge voltage PCV and equalization signal PEQ, and receives a column select signal CSL from the column decoder 206. If the column select signal CSL is a low voltage (e.g., ground), the voltage sense amplifier 604 does not send output to the output line I0 and complementary output line I0B. If the sense amplifier 604 is disabled, the equalization signal PEQ may be enabled. This equalizes the voltages on the sensing bit line SBL and complementary sensing bit line SBLB to the pre-charge voltage PCV. If the voltage sense amplifier 604 is enabled, the equalization is disabled by the equalization signal PEQ and then the column select signal CSL can be enabled as a high voltage. The voltage sense amplifier 604 senses and amplifies a voltage difference between the sense bit line SBL and the intermediate sense bit line SBLB, and the amplified difference is output on an output line IO and complementary output line IOB. As shown in FIG. 5, an IO sense amplifier 208 further sense amplifies the data represented by the voltage difference on the output line IO and complementary output line IOB to generate a data output. In summary, the voltage sense amplifier 604 is enabled when the control bias signal LA is high voltage and control bias signal LAB is low voltage, the voltage sense amplifier 604 is disabled when the control bias signal LA is low voltage and control bias signal LAB is high voltage, and the equalization signal PEQ is activated as a high voltage signal to pre-charge the sensing and complementary sensing lines SBL and SBLB to the pre-charge voltage PCV.

As will become apparent from the discussion below, the memory array and sensing structure 200 of this embodiment permits control of the source line voltage such that a greater voltage difference between the charges stored by the true cell FN and the complementary cell FNB are created. As a result, a greater voltage difference exists between voltages on the bit line BL and complementary bit line BLB such that a current sense amplifier is no longer necessary and a voltage sense amplifier alone may be used to sense and amplify the voltage difference.

Figure 8:
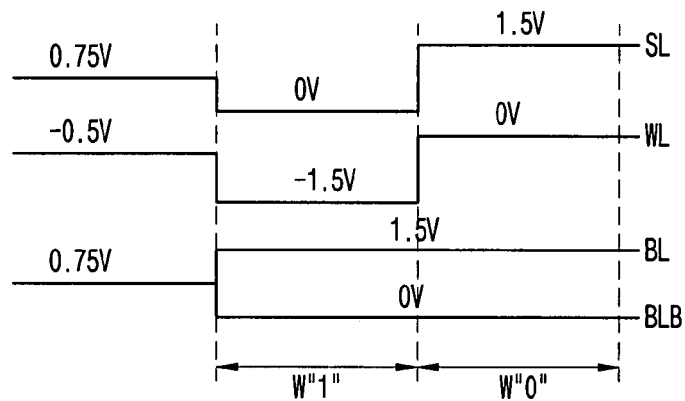
FIG. 8 illustrates in graphical and timing form the application of voltages to write a "1" and then a "0" according to Table 1 below.

FIG. 8 illustrates in graphical and timing form, the application of voltages to write a "1" to a true cell FN and then a "0" to complementary cell FNB. However, it will be understood that a "0" may be written to a true cell FN before a "1" is written to complementary cell FNB. As shown, during a pre-charge state, the source line SL and bit linens BL and BLB are pre-charged to 0.75V. During writing a "1" to true cell FN, the source lines SL and a selected word line WL are biased by 0V and −1.5V respectively, and a selected bit line BL and complementary bit line BLB are biased by 1.5V and 0V through the IO line and IOB line in response to the column select signal CSL such that the true cell FN connected to the bit line is written into data "1" by GIDL while the complementary cell FNB is not affected. After writing data "1", the complementary data "0" is written into the complementary cell FNB. So, for writing complementary data "0", the source lines SL and the selected word line WL are biased 1.5V and 0V respectively such that the complementary cell FNB is written by the coupling effect while the true cell FN is not affected. Table 1 below shows an example of word line (gate), bit line (drain) and source line (source) voltages applied by the row decoder 204, the column decoder 206 and the source line power supply 210 to pre-charge and write to the memory array and sensing structure 200 for the embodiment of FIG. 8. As will be appreciated with respect to Table 1 and the other tables in this disclosure, X→Y means the voltage changes from X to Y.

TABLE 1

| Condition | S(SL) | G(WL) | D(BL) | |
|---|---|---|---|---|
| W "1" | 0 -> 1.5 | −1.5 -> 0 | 1.5 | Bias condition for Writing data "1" Using GIDL |
| W "0" | 0 -> 1.5 | −1.5 -> 0 | 0 | Bias condition for Writing data "0" Using coupling effect |
| U "1" | 0 -> 1.5 | −0.5 | 1.5 | Partially selected cell bias by BL data "1" |
| U "0" | 0 -> 1.5 | −0.5 | 0 | Partially selected cell bias by BL data "0" |
| SW | 0.75 | −1.5 -> 0 | 0.75 | Partially selected cell bias by WL |
| NO | 0.75 | −0.5 | 0.75 | Not selected cell |

Table 1 also shows the voltages applied to partially selected cells. The U "1" entry and U "0" entry represent cells in the same row as a selected cell during writing of a "1" and "0", respectively. The SW entry represents cells in the same column as a selected cell. Table 1 also shows the voltages applied to non-selected cells by the entry NO.

Table 2 below shows an example of word line (gate), bit line (drain) and source line (source) voltages applied by the row decoder 204, the column decoder 206 and the source line power supply 210 to read from the memory array and sensing structure 200.

TABLE 2

| | S(SL) | G(WL) | D(BL) | |
|---|---|---|---|---|
| Read condition | 1.5 | 1.5 | Floating after Vbl pre-charging | Sense and amplify ΔVbl between SBL and SBLB. ΔVbl = Vth0 − Vth1 |

Referring to Table 2, to read data from a memory cell, a source line voltage of 1.5V and a word line voltage of 1.5V are applied. The bit line floats after pre-charging into the pre-charge voltage PCV by the control circuit 622. Namely, the bit line pair attains the voltage according to the data stored in the read memory cell and then the voltage difference (ΔVb1) between the bit line BL and complementary bit line BLB substantially equals difference of Vth0 minus Vth1. The voltage sense amplifier senses and amplifies this voltage difference ΔVb1.

Figure 9:
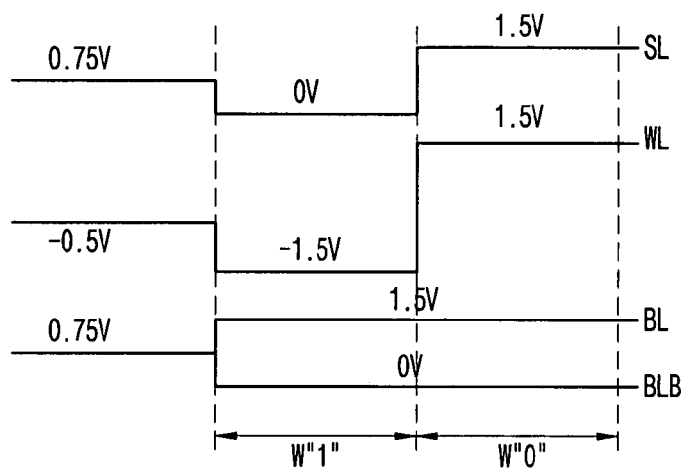
FIG. 9 illustrates in graphical and timing form the application of voltages to write a "1" and then a "0" according to Table 3 below.

FIG. 9 illustrates in graphical and timing form, the application of voltages to write a "1" to true cell and then a "0" to complementary cell according to another embodiment. However, it will be understood that a "0" may be written before a "1". To increase the speed of writing a "0", a selected word line is biased at 1.5V, which causes channel current of the floating body cell.

Tables 3 and 4 below show examples of word line (gate), bit line (drain) and source line (source) voltages applied by the row decoder 204, the column decoder 206 and the source line power supply 210 to pre-charge, write to and read from the memory array and sensing structure 200 for the embodiment of FIG. 9.

TABLE 3

| Condition | S(SL) | G(WL) | D(BL) | |
|---|---|---|---|---|
| W "1" | 0 -> 1.5 | −1.5 -> 1.5 | 1.5 | Bias condition for Writing data "1" |
| W "0" | 0 -> 1.5 | −1.5 -> 1.5 | 0 | Bias condition for Writing data "0" |
| U "1" | 0 -> 1.5 | −0.5 | 1.5 | Half selected cell bias by BL data "1" |
| U "0" | 0 -> 1.5 | −0.5 | 0 | Half selected cell bias by BL data "0" |
| SW | 0.75 | −1.5 -> 1.5 | 0.75 | half selected cell bias by WL |
| NO | 0.75 | −0.5 | 0.75 | Not selected cell |

TABLE 4

| | S(SL) | G(WL) | D(BL) | |
|---|---|---|---|---|
| Read condition | 1.5 | 1.5 | Floating after Vbl pre-charging | Sense and amplify ΔVbl between SBL and SBLB. ΔVbl = Vth0 − Vth1 |

Figure 10:
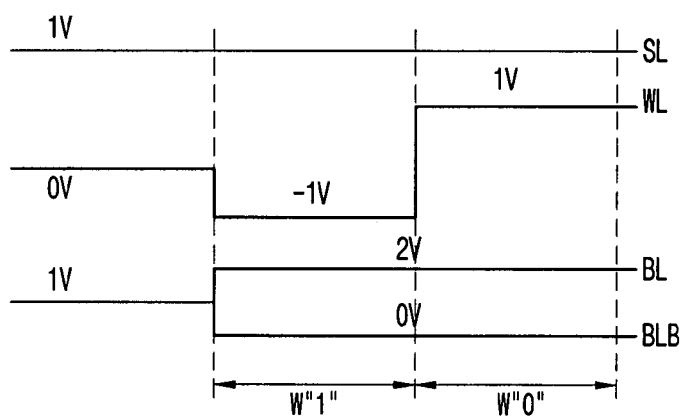
FIG. 10 illustrates in graphical and timing form the application of voltages to write a "1" and then a "0" according to Table 5 below.

FIG. 10 illustrates in graphical and timing form, the application of voltages to write a "1" to true cell and then a "0" to complementary cell according to a further embodiment. However, it will be understood that a "0" may be written before a "1". As shown, the embodiment of FIG. 10 differs from the embodiments of FIGS. 8 and 9 in that the source line voltage is kept constant. Also, the word line and bit line voltages may be greater.

Tables 5 and 6 below show examples of word line (gate), bit line (drain) and source line (source) voltages applied by the row decoder 204, the column decoder 206 and the source line power supply 210 to pre-charge, write to and read from the memory array and sensing structure 200 for the embodiment of FIG. 10.

TABLE 5

| Condition | S(SL) | G(WL) | D(BL) | |
|---|---|---|---|---|
| W "1" | 1 | −1 -> 1 | 2 | Bias condition for Writing data "1" |
| W "0" | 1 | −1 -> 1 | 0 | Bias condition for Writing data "0" |
| U "1" | 1 | 0 | 2 | Half selected cell bias by BL "1" |
| U "0" | 1 | 0 | 0 | Half selected cell bias by BL "0" |
| SW | 1 | −1 -> 1 | 1 | half selected cell bias by WL |
| NO | 1 | 0 | 1 | Not selected cell |

TABLE 6

| | S(SL) | G(WL) | D(BL) | |
|---|---|---|---|---|
| Read condition | 2 | 2 | Floating after Vbl(=1) pre-charging | Sense and amplify ΔVbl between SBL and SBLB. ΔVbl = Vth0 − Vth1 |

Figure 11:
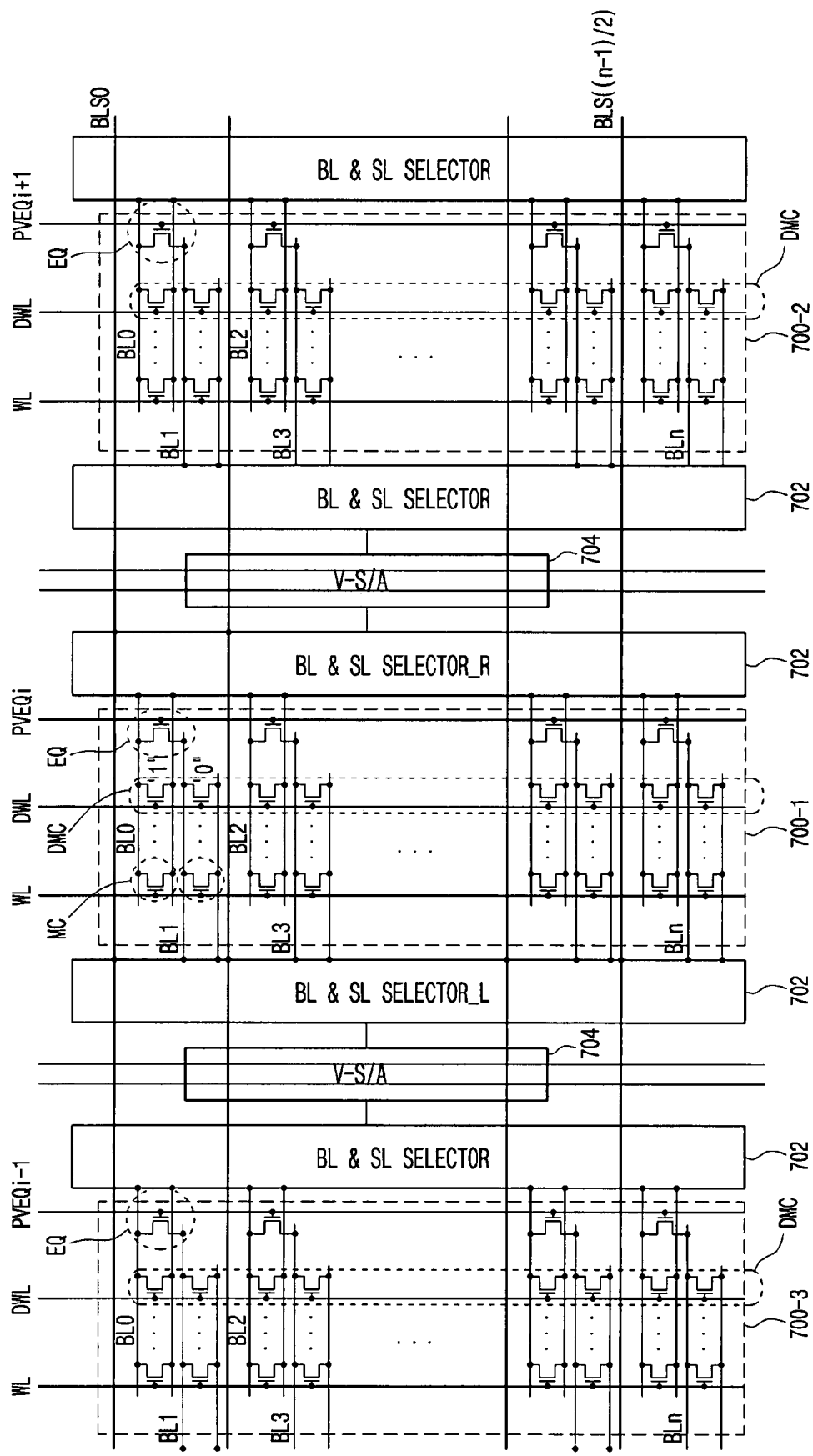
FIG. 11 illustrates a portion of a cell array and data sense circuits connected thereto in the memory array and sensing structure 200 of FIG. 5 according to another embodiment.

FIG. 11 illustrates a portion of a cell array and data sense circuits connected thereto in the memory array and sensing structure 200 of FIG. 5 according to another embodiment. It will be appreciated that the structure of FIG. 6 may be repeated many times to form the memory array and sensing structure 200. In this embodiment, the memory array has an open bit line structure as opposed to the twin cell structure of FIG. 6. As shown, the memory array and sensing structure includes memory array portions 700. A bit line (BL) and source line (SL) selector 702 is disposed on either side of each memory array portion 700, and a voltage sense amplifier 704 is disposed between adjacent BL and SL selectors 702. Outermost BL and SL selectors 702 have a voltage sense amplifier 704 disposed adjacent thereto. The BL and SL selectors 702 and the voltage sense amplifiers 704 will be described in greater detail below with respect to FIG. 12.

Still referring to FIG. 11, the memory array portions 700 include a plurality of word lines WL intersecting with a plurality of bit lines BL and source lines SL. The plurality of bit lines BL and source lines SL are in parallel. Memory cells are formed at intersections of the word lines WL and the bit lines BL. The memory array portions 700 employ capacitor-less memory cells MC that may have the same structure as described previously with respect to FIG. 3; namely, floating body cells may be employed. In particular, the memory array portions 700 employs an open bit line structure for storing data. Namely, unlike the embodiment of FIG. 6, there are no complementary cells FNB, complementary bit lines. Each memory cell MC may be a floating body cell or MISFET with a gate connected to a word line WL, a source connected to a source line SL and a drain connected to a bit line BL.

The memory array portion 700 includes memory cells MC arranged in columns and rows, the number of each of which being a matter of design choice. Each row of memory cells is associated with a word line WL0, WL1, etc. Each column of memory cells MC is associated with a bit line BL and a source line SL. Even numbered bit lines BL0, BL2, etc. lead to the BL and SL selector_R 702 to the right of the memory array portion 700. Odd numbered bit lines BL1, BL3, etc. lead to the BL and SL selector_L 702 to the left of the memory array portion 700. Similarly, even numbered source lines SL0, SL2, etc. lead to the BL and SL selector_R 702 to the right of the memory array portion 700. Odd numbered source lines SL1, SL3, etc lead to the BL and SL selector_L 702 to the left of the memory array portion 700. Accordingly, half of the bit lines and source lines lead to the BL and SL selector 702 to the right of the memory array portion 700, and the other half lead to the BL and SL selector 702 to the left of the memory array portion 700.

Furthermore, each memory array portion 700 includes a row of dummy cells DMC connected to a dummy word line DWL. The dummy word lines DWL may be controlled by the row decoder 204. The dummy memory cells DMC connected to even numbered bit lines BL0, BL2, etc. store a "1", and the dummy memory cells DMC connected to odd numbered bit line BL1, BL3, etc. store a "0". It will be appreciated that the opposite arrangement may be employed. Still further, an equalization transistor EQ connects each odd numbered bit line (e.g., BL1) with its preceding even numbered bit line (e.g., BL0), and each equalization transistor EQ in a row of equalization transistors EQs is connected to a same equalization control signal line PVEQ. The row decoder 204 may control the equalization control signal lines PVEQs.

During a write operation, the dummy word lines DWL and equalization control signal lines PVEQ are disabled; for example, a logic low voltage (e.g., ground) is applied to these lines. During a read operation from, for example, a first memory array portion 700-1, the dummy word line DWL and equalization control signal line PVEQ of the first memory array portion 700-1 are disabled, while the dummy word line DWL and equalization control signal PVEQ of the adjacent second and third memory array portions 700-2 and 700-3 may be enabled. As a result, the "1" and the "0" stored by the dummy memory cells DMC are averaged such that the averaged voltage outputs on the bit lines BL0, BL1, etc. of the second and third memory array portions 700-2 and 700-3 as a reference voltage for the voltage sense amplifier. As will described in detail below, the read data of the selected memory array portion will be selected by the associated BL and SL selector 702 for output to the voltage sense amplifier 704, and the reference voltage will be selected by the other BL and SL selector 702 associated with the voltage sense amplifier 704 and output to the voltage sense amplifier 704. The voltage sense amplifier 704 senses and amplifies based on the received read voltage and the reference voltage.

Figure 12:
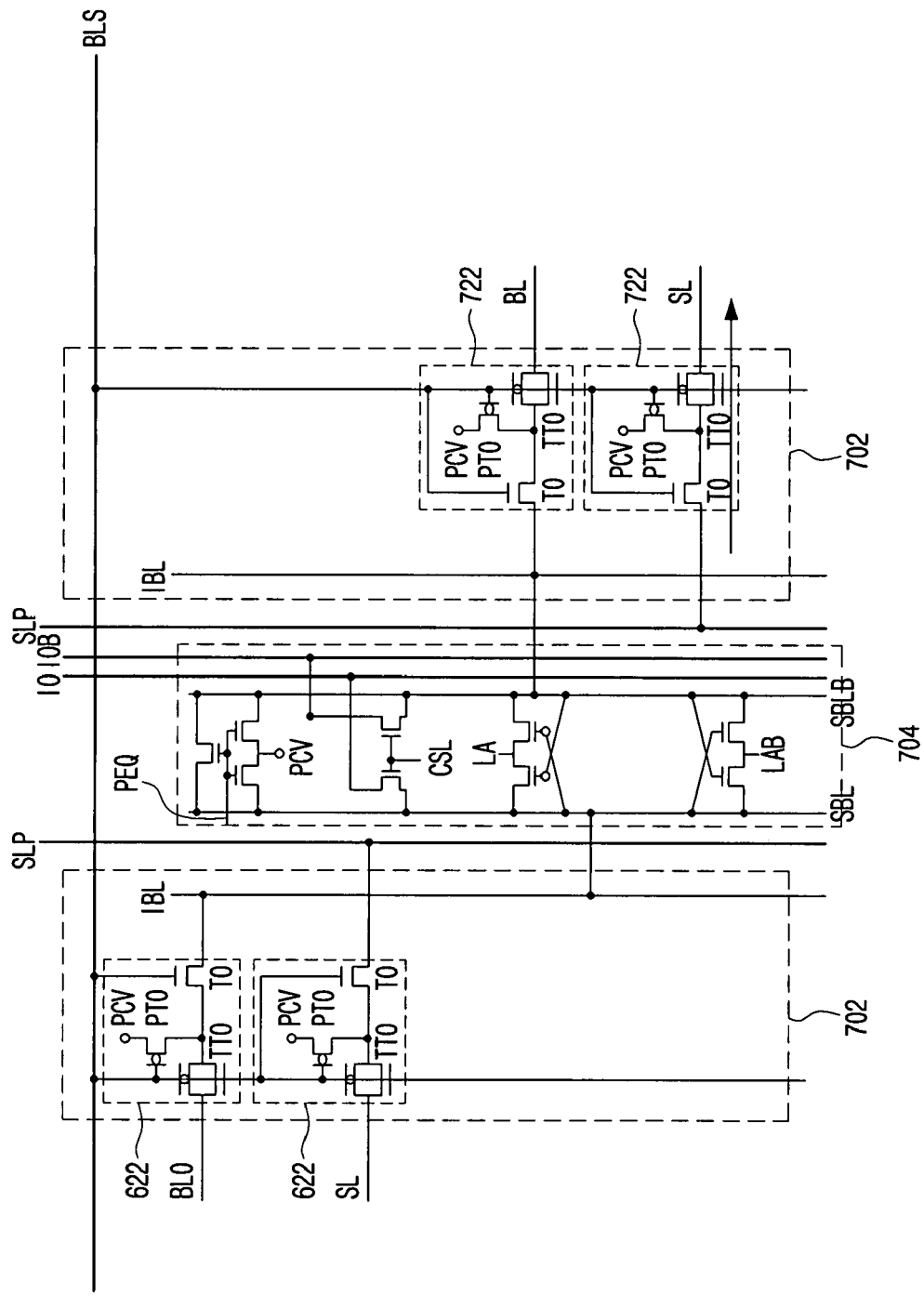
FIG. 12 illustrates the data sense circuit of FIG. 11 in greater detail.

FIG. 12 illustrates the data sense circuit of FIG. 11 in greater detail. Namely, FIG. 12 illustrates the circuits associated with a single voltage sense amplifier. It will be appreciated that the other voltage sense amplifiers and associated circuits may have the same structure and operation as that described with respect to FIG. 12. More particularly, FIG. 12 shows the detailed structure of a voltage sense amplifier 704 and the pair of BL and SL selectors 702 associated with the voltage sense amplifier 704.

As shown, each BL and SL selector 702 includes a control structure 622 associated with each bit line BL and associated source line SL. The control structure 622 is the same as described above with respect to FIG. 7. And, as shown in FIG. 12, the NMOS transistor T0 in the control structure 622 for a bit line BL is connected to an intermediate bit line IBL, and the NMOS transistor T0 in the control structure 622 for a source line SL is connected to the source power line SLP from the source line power supply 210 for the associated column of memory cells MC.

During operation, a low voltage (e.g., ground voltage) bit line select signal BLS disables the control structures 622 associated with that bit line select signal BLS such that the control structures 622 disconnect the bit line BL and source line SL from the intermediate bit line IBL and source power line SLP, respectively. However, the PMOS transistor PT0 in each control structure 622 receiving the low voltage bit line select signal BLS turns on. As a result, the pre-charge voltage PCV is supplied to the bit line BL and the source line SL.

During operation, a high voltage bit line select signal BLS turns off the PMOS transistor PT0 such that the pre-charge voltage PVC is not supplied to the bit line BL and source line SLB. Instead, the NMOS transistor T0 turns on. As a result, the bit line BL is connected to the intermediate bit line IBL, and the source line SL is connected to the source power line SLP.

The voltage sense amplifier 704 is a conventional voltage sense amplifier well-known in the art, and is the same as the voltage sense amplifier 604 illustrated in FIG. 7. Accordingly, the structure and operation of the voltage sense amplifier 704 will not be repeated for the sake of brevity.

During a read operation, the memory array portions 700 are controlled as discussed above such that read data from one memory array portions 700 is supplied to one of the sensing bit line SBL and complementary sensing bit line SBLB of the voltage sense amplifier 704, and the reference voltage is supplied to the other of the sensing bit line SBL and complementary sensing bit line SBLB from another of the memory array portions 700.

As will become apparent from the discussion below, the memory array and sensing structure of this embodiment permits control of the source line voltage such that a greater voltage difference between reference voltage and the charge stored by a memory is created. As a result, a greater voltage difference exists between voltage on the bit line BL and the reference voltage such that a current sense amplifier is no longer necessary and a voltage sense amplifier alone may be used to sense and amplify the voltage difference.

Tables 7 and 8 below show an example of word line (gate), bit line (drain) and source line (source) voltages applied by the row decoder 204, the column decoder 206 and the source line power supply 210 to pre-charge, write to and read from the memory array and sensing structure of FIGS. 11-12.

TABLE 7

| Condition | S(SL) | G(WL) | D(BL) | |
|---|---|---|---|---|
| W "1" | 1 | −1 -> 1 | 2 | Bias condition for Writing "1", Using GIDL |
| W "0" | 1 | −1 -> 1 | 0 | Bias condition for Writing "0". Using coupling effect |
| U "1" | 1 | 0 | 2 | Half selected cell bias by BL "1" |
| U "0" | 1 | 0 | 0 | Half selected cell bias by BL "0" |
| SW | 1 | −1 -> 1 | 1 | half selected cell bias by WL |
| NO | 1 | 0 | 1 | Not selected cell |

TABLE 8

| | S(SL) | G(WL) | D(BL) | |
|---|---|---|---|---|
| Read condition | 2 | 2 | Floating after Vbl(=1) pre-charging | Sense and amplify ΔVbl between SBL and SBLB. ΔVbl = (Vth0 − Vth1)/2 |

Figure 13:
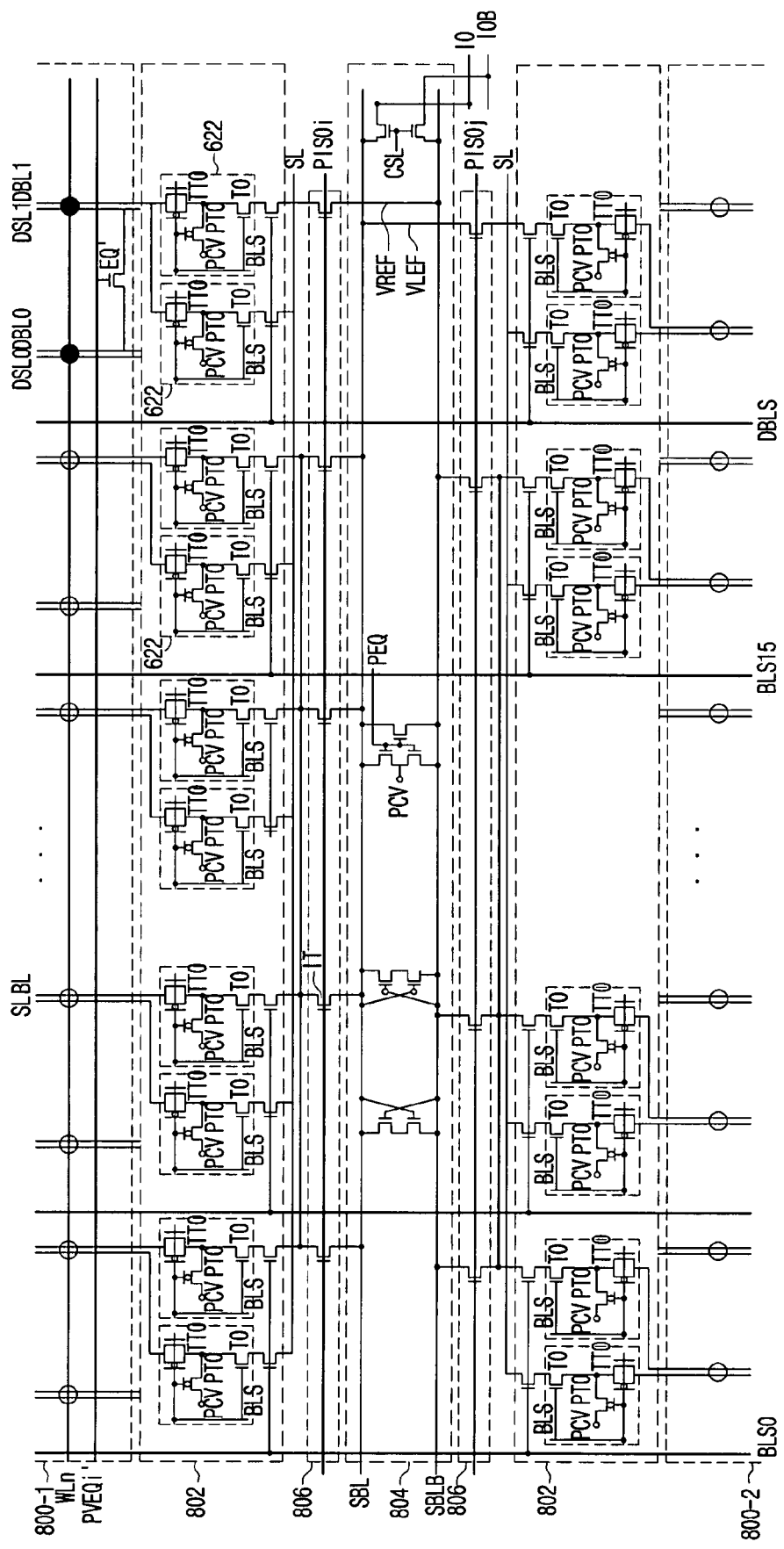
FIG. 13 illustrates a portion of a cell array and data sense circuits connected thereto in the memory array and sensing structure 200 of FIG. 5 according to a further embodiment.

FIG. 13 illustrates a portion of a cell array and data sense circuits connected thereto in the memory array and sensing structure 200 of FIG. 5 according to a further embodiment. It will be appreciated that the structure of FIG. 6 may be repeated many times to form the memory array and sensing structure 200. In this embodiment, the memory array has an open bit line structure. As shown, the memory array and sensing structure includes memory array portions 800. A bit line (BL) and source line (SL) selector 802 is disposed on either side of each memory array portion 800, and a voltage sense amplifier 804 is disposed between adjacent BL and SL selectors 802. Outermost BL and SL selectors 802 have a voltage sense amplifier 804 disposed adjacent thereto.

The memory array portions 800 include a plurality of word lines WL intersecting with a plurality of bit lines BL and source lines SL. The plurality of bit lines BL and source lines SL are in parallel. Memory cells are formed at intersections of the word lines WL and the bit lines BL. The memory array portions 800 may employ capacitor-less memory cells MC that have the same structure as described previously with respect to FIG. 3; namely, floating body cells may be employed. In particular, the memory array portions 800 employs an open bit line structure for storing data. Namely, unlike the embodiment of FIG. 6, there are no complementary cells FNB, complementary bit lines and complementary source lines. Each memory cell MC may be a floating body cell or MISFET with a gate connected to a word line WL, a source connected to a source line SL and a drain connected to a bit line BL.

The memory array portion 800 includes memory cells MC arranged in columns and rows, the number of each of which being a matter of design choice. Each row of memory cells is associated with a word line WL0, WL1, etc. Each column of memory cells MC is associated with a bit line BL and a source line SL. Even numbered bit lines BL0, BL2, etc. lead to the BL and SL selector_R 702 to the right of the memory array portion 700. Odd numbered bit lines BL1, BL3, etc. lead to the BL and SL selector_L 702 to the left of the memory array portion 700. Similarly, even numbered source lines SL0, SL2, etc. lead to the BL and SL selector_R 702 to the right of the memory array portion 700. Odd numbered source lines SL1, SL3, etc lead to the BL and SL selector_L 702 to the left of the memory array portion 700. Accordingly, half of the bit lines and source lines lead to the BL and SL selector 702 to the right of the memory array portion 700, and the other half lead to the BL and SL selector 702 to the left of the memory array portion 700.

Furthermore, each memory array portion 800 includes two columns of dummy cells DMC connected to dummy bit lines DBL0 and DBL1, respectively, and to dummy source lines DSL0 and DSL1, respectively. The dummy memory cells DMC connected to even numbered dummy bit line DBL0 etc. store a "1", and the dummy memory cells DMC connected to odd numbered bit line DBL1 store a "0". It will be appreciated that the opposite arrangement may be employed. Still further, an equalization transistor EQ' connects the odd numbered dummy bit line DBL1 with the even numbered dummy bit line DBL0, and each equalization transistor EQ' is connected to a respective equalization control signal line PVEQ'. The row decoder 204 or the column decoder 206 may control the equalization control signal lines PVEQ's.

During a write operation, the equalization control signal lines PVEQ' are disabled; for example, a logic low voltage (e.g., ground) is applied to these lines. During a read operation from, for example, a first memory array portion 800-1, the word line WL including the memory cell MC being read is enabled. As a result, the data stored in the dummy memory cells DMC associated with that word line WL are also read. And, the equalization transistor EQ' associated with the first memory array portion 800-1 is also enabled. As a result, the "1" and the "0" stored by the dummy memory cells DMC are averaged and output on the dummy bit lines DBL0 and DBL1 of the first memory array portion 800-1 as a reference voltage VREF for the data sense circuit.

FIG. 13 also illustrates the data sense circuit in detail. Namely, FIG. 13 illustrates the circuits associated with a voltage sense amplifier 804. It will be appreciated that the other voltage sense amplifiers and associated circuits may have the same structure and operation as that described with respect to FIG. 13. More particularly, FIG. 13 shows the detailed structure of a voltage sense amplifier 804 and the pair of BL and SL selectors 802 associated with the voltage sense amplifier 804.

As shown, each BL and SL selector 802 includes a control structure 622 associated with each bit line BL and associated source line SL as well as the dummy bit lines DLB0 and DBL1 and dummy source lines DSL0 and DSL1. The control structure 622 is the same as described above with respect to FIG. 7. As shown in FIG. 13, the NMOS transistor T0 in the control structure 622 for a source line SL is connected to the source power line SLP from the source line power supply 210 for the associated column of memory cells MC. The NMOS transistor T0 in the control structure 622 for a bit line BL is connected to an associated isolation transistor IT in a row of isolation transistors 822. Each isolation transistor IT in a row of isolation transistors 822 selectively connects a corresponding bit line to a same one of the sense bit line SBL and complementary sense bit line SBLB of the voltage sense amplifier 804. However, the isolation transistors IT for the dummy bit lines DBL0 and DBL1 selectively connects the dummy bit lines DBL0 and DBL1 to other of the sense bit line SBL and complementary sense bit line SBLB from the bit lines BLs. Furthermore each of the isolation transistors IT in a row 822 has its gate connected to a same respective isolation control line PISO. The row decoder 204 or the column decoder 206 may control the isolation control lines PISOs. Accordingly, the row decoder 204 controls the isolation control lines PISO such that only one of the memory array portions 800 is connected with a respective voltage sense amplifier 804.

During operation, a low voltage (e.g., ground voltage) bit line select signal BLS disables the control structures 622 associated with that bit line select signal BLS such that the control structures 622 disconnects the bit line BL and source line SL from the intermediate bit line IBL and source power line SLP, respectively. However, the PMOS transistor PT0 in each control structure 622 receiving the low voltage bit line select signal BLS turns on. As a result, the pre-charge voltage PCV is supplied to the bit line BL and the source line SL.

During operation, a high voltage bit line select signal BLS turns off the PMOS transistor PT0 such that the pre-charge voltage PVC is not supplied to the bit line BL and source line SLB. Instead, the NMOS transistor T0 turns on. As a result, the bit line BL is connected to the intermediate bit line IBL, and the source line SL is connected to the source power line SLP.

The voltage sense amplifier 804 is a conventional voltage sense amplifier well-known in the art, and is the same as the voltage sense amplifier 604 illustrated in FIG. 7. Accordingly, the structure and operation of the voltage sense amplifier 804 will not be repeated for the sake of brevity.

During a read operation, the memory array portions 800 are controlled as discussed above such that read data from one memory array portions 800 is supplied to one of the sensing bit line SBL and complementary sensing bit line SBLB of the voltage sense amplifier 804, and the reference voltage is supplied to the other of the sensing bit line SBL and complementary sensing bit line SBLB from the same memory array portions 800.

For the embodiment of FIG. 13, the example of word line (gate), bit line (drain) and source line (source) voltages given above with respect to Tables 7 and 8 may be used to pre-charge, write to and read from the memory array and sensing structure of FIG. 13.

Figure 14:
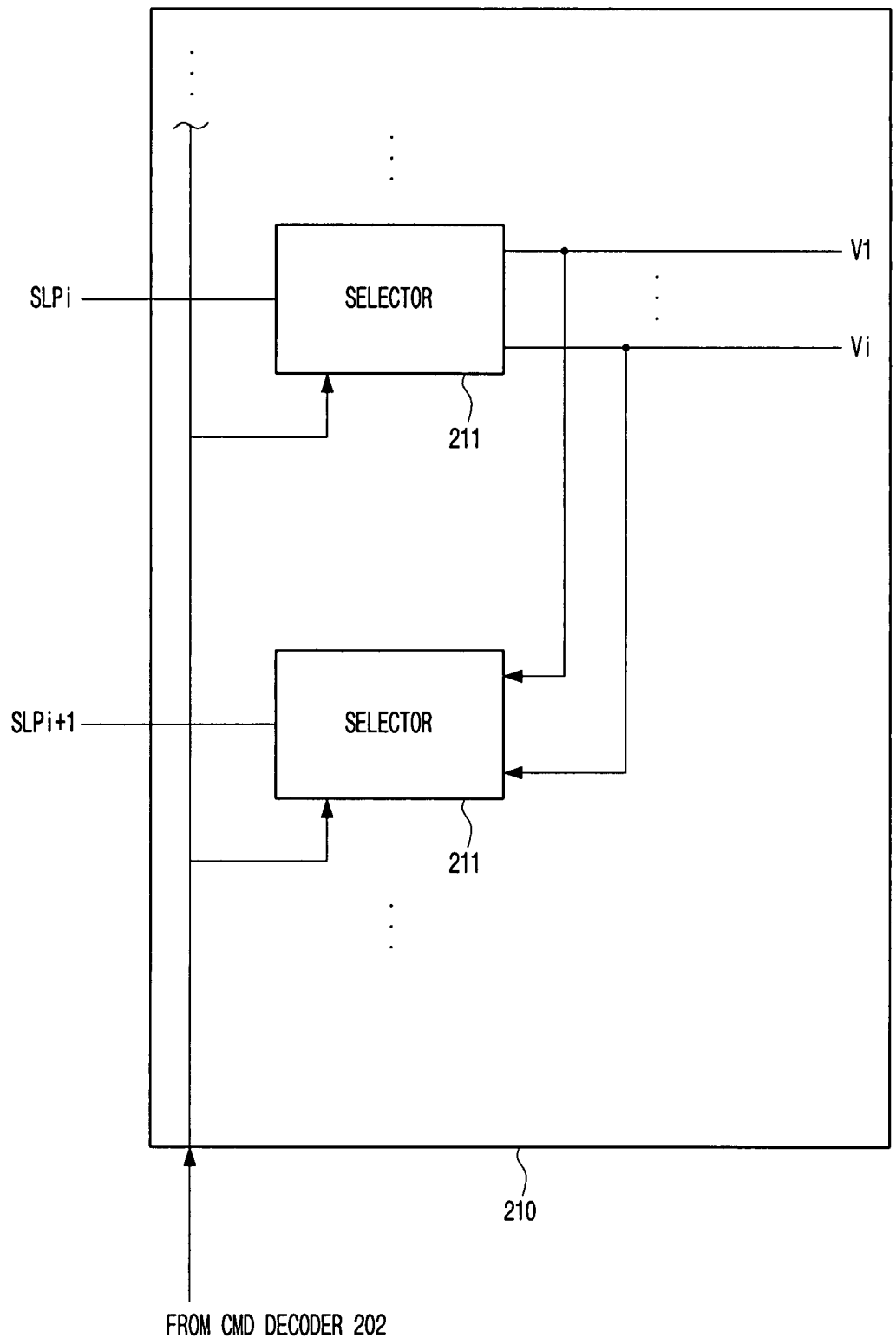
FIG. 14 illustrates an example embodiment of the source power line supply in FIG. 5.

FIG. 14 illustrates an example embodiment of the source power line supply 210. As shown, the source power line supply 210 includes an memory array of selectors 211. Each selector 211 is associated with a respective source power line SLP. Each selector 211 receives a number of voltages V1, etc. The voltages received may be in accordance with the embodiments shown by Tables 1-2, 3-4, 5-6, 7-8, and/or may be matter of design choice. Each selector 211 selectively outputs one of the voltage V1, etc. based on control signals including the memory array information from the command decoder 202 to effect a read, write, etc. operation as described in the above embodiments.

Figure 15:
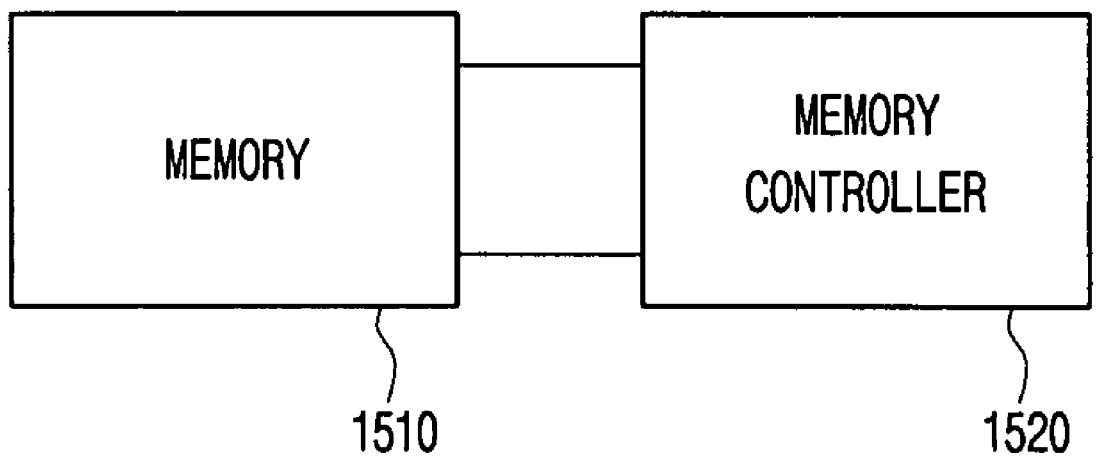
FIG. 15 illustrates an additional example embodiment employing a semiconductor memory.

FIG. 15 illustrates another embodiment. As shown, this embodiment includes a memory 1510 connected to a memory controller 1520. The memory 1510 may be any of the semiconductor memory devices discussed above. The memory controller 1520 supplies the input signals for controlling operation of the memory 1510. For example, in the case of the semiconductor memory device of FIG. 5, the memory controller 1520 supplies the command CMD and address signals.

It will be appreciated that the memory controller 1520 may control the memory 1510 based on received control signals (not shown).

The invention being thus described, it will be obvious that the same may be varied in many ways. Such variations are not to be regarded as a departure from the invention, and all such modifications are intended to be included within the scope of the invention.

We claim:

1. A semiconductor integrated circuit, comprising:
   a plurality of word lines;
   a plurality of source lines;
   a plurality of bit lines intersecting with the plurality of word lines;
   a plurality of memory cells formed at intersections of the plurality of word lines and the plurality of bit lines, each of the plurality of memory cells being a floating body cell, a gate of each floating body cell connected to one of the word lines, a drain of each floating body cell connected to one of the bit lines, and a source of each floating body cell connected to one of the source lines;
   at least one bit line and source line selecting circuit, being responsive to a common select signal, configured to selectively connect at least one of the plurality of bit lines to a first output bit line and to selectively connect at least one source line of the plurality of source lines corresponding to the at least one bit line to a source voltage; and
   at least one sense amplifier configured to sense data based on a voltage on the first output bit line.

2. The circuit of claim 1, wherein the bit line and source selecting circuit includes a switching structure associated with each bit line, each switching structure configured to selectively connect the associated bit line to the first output bit line.

3. The circuit of claim 2, wherein each switching structure is configured to selectively supply a pre-charge voltage to the associated bit line.

4. The circuit of claim 3, wherein each switching structure operates based on a selecting signal such that if the selecting signal is in a first state, the switching structure connects the associated bit line to the first output bit line, and if the selecting signal is in a second state, the switching structure supplies the pre-charge voltage to the associated bit line.

5. The circuit of claim 1, wherein the bit line and source selecting circuit includes a switching structure associated with each source line, each switching structure configured to selectively connect the associated source line with the source voltage.

6. The circuit of claim 5, wherein each switching structure is configured to selectively supply a pre-charge voltage to the associated source line.

7. The circuit of claim 6, wherein each switching structure operates based on a selecting signal such that if the selecting signal is in a first state, the switching structure connects the associated source line to the source voltage, and if the selecting signal is in a second state, the switching structure supplies the pre-charge voltage to the associated source line.

8. The circuit of claim 1, wherein the bit line and source selecting circuit includes a first switching structure associated with each bit line and a second switching structure associated with each source line, each first switching structure configured to selectively connect the associated bit line to the first output bit line, and each second switching structure configured to selectively connect the associated source line with the source voltage.

9. The circuit of claim 8, wherein each first switching structure is configured to selectively supply a pre-charge voltage to the associated bit line, and each second switching structure is configured to selectively supply a pre-charge voltage to the associated source line.

10. The circuit of claim 8, wherein each first switching structure operates based on a selecting signal such that if the selecting signal is in a first state, the first switching structure connects the associated bit line to the first output bit line, and if the selecting signal is in a second state, the first switching structure supplies the pre-charge voltage to the associated bit line; and each second switching structure operates based on the selecting signal such that if the selecting signal is in the first state, the second switching structure connects the associated source line to the source voltage, and if the selecting signal is in the second state, the second switching structure supplies the pre-charge voltage to the associated source line.

11. The circuit of claim 1, wherein the bit line and source line selecting circuit selectively connects each of the plurality of source lines to a source power line.

12. The circuit of claim 1, further comprising:
a switching structure configured to selectively connect the sense amplifier to the first output bit line.

13. The circuit of claim 1, wherein the sense amplifier is a voltage sense amplifier.

14. The circuit of claim 1, wherein the plurality of bit lines, the plurality of word lines and the plurality of memory cells form a twin cell memory structure.

15. The circuit of claim 1, wherein the plurality of bit lines, the plurality of word lines and the plurality of memory cells form an open bit line structure.

16. The circuit of claim 1, further comprising:
a first control circuit configured to control operation of the bit line and source line selecting circuit.

17. The circuit of claim 16, further comprising:
a second control circuit configured to apply voltages to the plurality of source lines.

18. The circuit of claim 17, wherein the second control circuit is configured to apply different voltages to the plurality of source lines depending on a memory cell operation.

19. The circuit of claim 18, wherein the control circuit is configured to apply a first voltage to the source line of the floating body cells if a data 1 is being written into the floating body cell, and is configured to apply a second voltage to the source line of the floating body cell if a data 0 is being written into the floating body cell, the second voltage being different than the first voltage.

20. The circuit of claim 19, wherein the first voltage is less than the second voltage.

21. The circuit of claim 18, wherein the control circuit is configured to apply a different voltage to the source line of the floating body cell during a read operation than applied during at least one of the write operations.

22. The circuit of claim 21, wherein the control circuit is configured to apply a higher voltage to the source line of the floating body cell during the read operation than applied during at least one of the write operations.

23. The circuit of claim 1, further comprising:
at least one dummy word line;
at least one row of dummy memory cells formed at intersections of the dummy word line and the plurality of bit lines, each of the plurality of dummy memory cells being a floating body cell, a gate of each dummy floating body cell connected to the dummy word line, a drain of each dummy floating body cell connected to one of the bit lines, and a source of each dummy floating body cell connected to one of the source lines, the dummy memory cells associated with even numbered bit lines for storing a first logic state, and the dummy memory cells associated with odd numbered bit lines for storing a second logic state, the second logic state being opposite the first logic state; and
an equalization circuit configured to selectively connect each odd numbered bit line and a preceding even numbered bit line.

24. The circuit of claim 1, further comprising:
first and second dummy bit lines;
first and second dummy source lines;
first and second columns of dummy memory cells, the first column of dummy memory cells formed at intersections of the plurality of word lines and the first dummy bit line, the second column of dummy memory cells formed at intersections of the plurality of word lines and the second dummy bit line, each of the first and second columns of memory cells being a floating body cell, a gate of each first dummy floating body cell connected to one of the word lines, a drain of each first dummy floating body cell connected to the first dummy bit line, and a source of each first dummy floating body cell connected to the second dummy source line, a gate of each second dummy floating body cell connected to one of the word lines, a drain of each second dummy floating body cell connected to the second dummy bit line, and a source of each second dummy floating body cell connected to the second dummy source line;
an equalization circuit configured to selectively connect the first dummy bit line and the second dummy bit line; and
the bit line and source line selecting circuit configured to selectively connect each of the first and second dummy bit lines to a second output bit line and to selectively connect the first and second dummy source lines to a source voltage; and
the sense amplifier configured to sense data based on voltages on the first output bit line and the second output bit line.

25. A semiconductor integrated circuit, comprising:
a plurality of word lines;
a plurality of source lines;
a plurality of bit lines intersecting with the plurality of word lines;
a plurality of memory cells formed at intersections the plurality of word lines and the plurality of bit lines, each of the plurality of memory cells being a floating body cell, a gate of each floating body cell connected to one of the word lines, a drain of each floating body cell connected to one of the bit lines, and a source of each floating body cell connected to one of the source lines;
a bit line and source line selecting circuit, being responsive to a common select signal, configured to selectively connect at least one of the plurality of bit lines to an output bit line and to selectively connect at least one source line of the plurality of source lines corresponding to the at least one bit line to a source voltage;
a sense amplifier configured to sense data on the output bit line; and
a control circuit configured to control operation of the bit line and source line selecting circuit and to control voltages applied to the plurality of source lines such that the sense amplifier is a voltage sense amplifier.

26. A semiconductor integrated circuit, comprising:
a plurality of word lines;

a plurality of source lines;

a plurality of bit lines intersecting with the plurality of word lines;

a plurality of memory cells formed at intersections the plurality of word lines and the plurality of bit lines, each of the plurality of memory cells being a floating body cell, a gate of each floating body cell connected to one of the word lines, a drain of each floating body cell connected to one of the bit lines, and a source of each floating body cell connected to one of the source lines;

a selecting circuit, being responsive to a common select signal, configured to selectively output data on at least one of the plurality of bit lines and to selectively apply voltages to at least one source line of the plurality of source lines corresponding to the at least one bit line; and a sense amplifier configured to sense data on the output bit line.

27. A semiconductor integrated circuit, comprising:

a plurality of memory cell portions, each memory cell portion including, a plurality of word lines, a plurality of source lines;

a plurality of bit lines intersecting with the plurality of word lines, and a plurality of memory cells formed at intersections the plurality of word lines and the plurality of bit lines, each of the plurality of memory cells being a floating body cell, a gate of each floating body cell connected to one of the word lines, a drain of each floating body cell connected to one of the bit lines, and a source of each floating body cell connected to one of the source lines; and at least one bit line and source line selecting circuit associated with each memory portion, each bit line and source line selecting circuit being responsive to a common select signal;

the bit line and source line selecting circuit being configured to selectively connect at least one of the plurality of bit lines in the associated memory portion to an output bit line for the memory portion and to selectively connect at least one source line of the plurality of source lines corresponding to the at least one bit line in the associated memory portion to a source voltage; and at least one sense amplifier associated with each memory portion, each sense amplifier configured to sense data on the output bit line of the associated memory cell portion.

28. A method of operating a semiconductor integrated circuit memory, the semiconductor integrated circuit memory including a plurality of memory cells formed at intersections of a plurality of word lines and a plurality of bit lines, each of the plurality of memory cells being a floating body cell, a gate of each floating body cell connected to one of the word lines, a drain of each floating body cell connected to one of the bit lines, and a source of each floating body cell connected to one of the source lines, the method comprising:

generating a common select signal;

applying different voltages to at least one of the plurality of bit lines responsive to the common select signal depending on a memory cell operation;

applying different voltages to at least one of the plurality of source lines corresponding to the at least one bit line responsive to the common select signal depending on the memory cell operation; and applying different voltages to the plurality of word lines depending on the memory cell operation.

29. The method of claim 28, wherein the applying step applies a first voltage to the source line of the floating body cells if a data 1 is being written into the floating body cell, and applies a second voltage to the source line of the floating body cell if a data 0 is being written into the floating body cell, the second voltage being different than the first voltage.

30. The method of claim 29, wherein the first voltage is less than the second voltage.

31. The circuit of claim 28, wherein the applying step applies a different voltage to the source line of the floating body cell during a read operation than applied during at least one write operation.

32. The circuit of claim 31, wherein the applying step applies a higher voltage to the source line of the floating body cell during the read operation than applied during at least one write operation.

33. A method of sense amplifying in a semiconductor integrated circuit memory, the semiconductor integrated circuit memory including a plurality of memory cells formed at intersections of a plurality of word lines and a plurality of bit lines, each of the plurality of memory cells being a floating body cell, a gate of each floating body cell connected to one of the word lines, a drain of each floating body cell connected to one of the bit lines, and a source of each floating body cell connected to one of the source lines, the method comprising:

generating a common select signal;

selectively connecting, being responsive to the common select signal, at least one of the plurality of bit lines to an output bit line;

applying a different voltage, based on the common select signal, to at least one of the plurality of source line corresponding to the at least one bit line of the floating body cell during a read operation than applied during at least one of the write operations;

applying different voltage to the plurality of word lines depending on a memory cell operation; and sense amplifying data on the output bit line using a voltage sense amplifier.

34. The method of claim 33, wherein the sensing step sense the data on the output bit line only using a voltage sense amplifier.

* * * * *